United States Patent
Hong et al.

(10) Patent No.: US 9,831,617 B1
(45) Date of Patent: Nov. 28, 2017

(54) FILTERED CONNECTOR AND FILTER BOARD THEREOF

(71) Applicant: ACBEL POLYTECH INC., New Taipei (TW)

(72) Inventors: Wei Hong, New Taipei (TW); Jia-Jiann Huang, New Taipei (TW); Hsiao-Kai Chen, New Taipei (TW); Chih-Chieh Tseng, New Taipei (TW)

(73) Assignee: ACBEL POLYTECH INC., New Taipei (TW)

( * ) Notice: Subject to any disclaimer, the term of this patent is extended or adjusted under 35 U.S.C. 154(b) by 0 days.

(21) Appl. No.: 15/262,475

(22) Filed: Sep. 12, 2016

(30) Foreign Application Priority Data

May 31, 2016 (CN) .................... 2016 2 0516815 U

(51) Int. Cl.
| | |
|---|---|
| H01R 13/74 | (2006.01) |
| H01R 13/66 | (2006.01) |
| H01R 13/6594 | (2011.01) |
| H01R 13/621 | (2006.01) |
| H05K 1/02 | (2006.01) |
| H05K 1/18 | (2006.01) |
| H05K 1/11 | (2006.01) |

(52) U.S. Cl.
CPC ....... *H01R 13/748* (2013.01); *H01R 13/6215* (2013.01); *H01R 13/6594* (2013.01); *H01R 13/665* (2013.01); *H05K 1/0224* (2013.01); *H05K 1/0231* (2013.01); *H05K 1/111* (2013.01); *H05K 1/181* (2013.01); *H05K 2201/09063* (2013.01); *H05K 2201/10015* (2013.01)

(58) Field of Classification Search
CPC ................... H01R 13/748; H01R 13/6215; H01R 13/6594
USPC ........................................ 439/654
See application file for complete search history.

(56) References Cited

U.S. PATENT DOCUMENTS

| | | | | |
|---|---|---|---|---|
| 4,473,755 | A * | 9/1984 | Imai ................ | H05K 1/0231 307/10.1 |
| 4,674,809 | A * | 6/1987 | Hollyday .......... | H01R 13/7197 439/580 |
| 5,101,322 | A * | 3/1992 | Ghaem ............. | H05K 7/20854 333/185 |
| 5,580,279 | A * | 12/1996 | Belopolsky ....... | H01R 13/6625 439/620.09 |
| 5,599,208 | A * | 2/1997 | Ward ............... | H01R 13/719 333/185 |

(Continued)

*Primary Examiner* — Alexander Gilman
(74) *Attorney, Agent, or Firm* — Rabin & Berdo, P.C.

(57) ABSTRACT

A filtered connector is mounted on a casing and includes a connection port and a filter board. An electrode plate mounted on one end of the connection port and electrically isolated from the casing is securely mounted through a through hole of the casing. The filter board has a circuit board assembly, multiple grounding spring plates and multiple filtering capacitors. The circuit board assembly has a slot to be mounted through by the electrode plate. The grounding spring plates are mounted on a surface of the circuit board assembly and electrically contact the casing. The filtering capacitors are electrically connected between the electrode plate and the grounding spring plates. As the filter board is not mounted inside the connection port, only the filter board is to be mounted without replacing the connection port, thereby lowering users' expense in installation of the filter board.

7 Claims, 9 Drawing Sheets

(56) References Cited

U.S. PATENT DOCUMENTS

| | | | | |
|---|---|---|---|---|
| 5,624,277 | A * | 4/1997 | Ward | H01R 13/7195 439/620.09 |
| 6,231,397 | B1 * | 5/2001 | de la Borbolla | H01R 13/6477 439/676 |
| 6,537,085 | B2 * | 3/2003 | Na | H05K 1/147 439/564 |
| 6,837,725 | B1 * | 1/2005 | Gordon | H01R 29/00 200/51.1 |
| 6,839,214 | B2 * | 1/2005 | Berberich | H01R 13/6625 361/112 |
| 7,046,499 | B1 * | 5/2006 | Imani | H01G 9/10 174/152 GM |
| 7,094,104 | B1 * | 8/2006 | Burke | H01R 24/42 439/620.01 |
| 7,182,644 | B2 * | 2/2007 | Cherniski | H01R 13/719 439/620.21 |
| 7,306,490 | B1 * | 12/2007 | Jeter et al. | H05K 9/0066 439/620.09 |
| 7,588,466 | B2 * | 9/2009 | Blasko et al. | B60L 11/1818 320/111 |
| 8,147,272 | B2 * | 4/2012 | Rhein | H01R 13/5202 439/556 |
| 9,214,769 | B2 * | 12/2015 | MacDougall | H01R 13/7032 |

* cited by examiner

US 9,831,617 B1

FILTERED CONNECTOR AND FILTER BOARD THEREOF

BACKGROUND OF THE INVENTION

1. Field of the Invention

The present invention relates to a connector and, more particularly, to a filtered connector and a filter board thereof.

2. Description of the Related Art

Electromagnetic interference (EMI) shielding capability has become one of the most important categories for electronic product design nowadays. Because of electromagnetic waves possibly generated and radiating into space upon operation of electric and electronic equipment, the electromagnetic waves may affect operation of other electronic equipment in the nearby. As such, how to lessen EMI is one of the critical subjects in electronic product design.

Vehicular electronic products are usually installed and operated in a narrow and small space inside vehicles. When too many electronic products are operated inside a vehicle, the electronic products are prone to EMI generated from each other. As more and more hybrid vehicles and electric vehicles contributable to development of automobile technology have been rolled out, upon being powered by electricity, the hybrid vehicles and electric vehicles also need to supply power to other electronic devices inside the vehicles, such as GPS navigation, radio, stereo and the like. However, power supplied to those other electronic devices through connectors of the vehicles easily generates electromagnetic waves interfering with operation of the electronic devices.

Latest technology used to reduce EMI arising from power supply is to provide a filter board on each connector to filter out high-frequency signals outputted from a power source so as to mitigate generation of electromagnetic waves and suppress EMI caused by electronic products. As existing filter boards are directly mounted inside the connection ports of the connectors, should installation of the filter boards be necessary, the original connection ports of the connectors must be totally replaced and fail to be reused. Therefore, purchase of entire set of new connectors certainly poses additional burden to users. Additionally, filtering of the high frequency signals outputted from power sources may not completely stop generation of electromagnetic waves, and EMI to other electronic equipment is still likely.

SUMMARY OF THE INVENTION

An objective of the present invention is to provide a filtered connector and a filter board thereof separately installed on a casing without replacing the entire connector upon installation of the filter board.

To achieve the foregoing objective, the filtered connector is mounted on a casing and includes a connection port and a filter board.

The connection port has an electrode plate mounted on an end of the connector port adapted to be mounted through and securely held in a through hole of the casing.

The filter board has a circuit board assembly, multiple grounding spring plates and multiple filtering capacitors.

The circuit board assembly has an elongated slot formed through the circuit board assembly to adjoin a first surface and a second surface of the circuit board assembly. The first surface and the second surface are opposite each other, the second surface faces the casing, and the electrode plate of the connection port is mounted through the elongated slot.

The multiple grounding spring plates are mounted on the second surface of the circuit board assembly to electrically contact the casing.

The multiple filtering capacitors are mounted on the first surface of the circuit board assembly. One end of each filtering capacitor is electrically connected to the electrode plate of the connection port, and the other end of the filtering capacitor is electrically connected to the multiple grounding spring plates.

To achieve the foregoing objective, the filter board includes a circuit board assembly, multiple grounding spring plates, at least one electrical connection spring leaf and multiple filtering capacitors.

The circuit board assembly has an elongated slot formed through the circuit board assembly to adjoin a first surface and a second surface of the circuit board assembly. The first surface and the second surface are opposite each other.

The multiple grounding spring plates are mounted on the second surface of the circuit board assembly.

The at least one electrical connection spring leaf is mounted on the first surface of the circuit board assembly and is located near an inner edge of the elongated slot.

The multiple filtering capacitors are mounted on the first surface of the circuit board assembly. One end of each filtering capacitor is electrically connected to the at least one electrical connection spring leaf, and the other end of the filtering capacitor is electrically connected to the multiple grounding spring plates.

Because the connection port and the filter board of the filtered connector are separately mounted, the filter board electrically contacts the casing through the grounding spring plates to provide an additional grounding path. Also because the filter board is not mounted inside the connection port, upon installation of the filter board, the connection port won't be necessarily replaced. Instead, it is just the filter board to be mounted for filtering high frequency noises without burdening users for purchase of new connection port.

Other objectives, advantages and novel features of the invention will become more apparent from the following detailed description when taken in conjunction with the accompanying drawings.

DETAILED DESCRIPTION OF THE INVENTION 10

Figure 1:
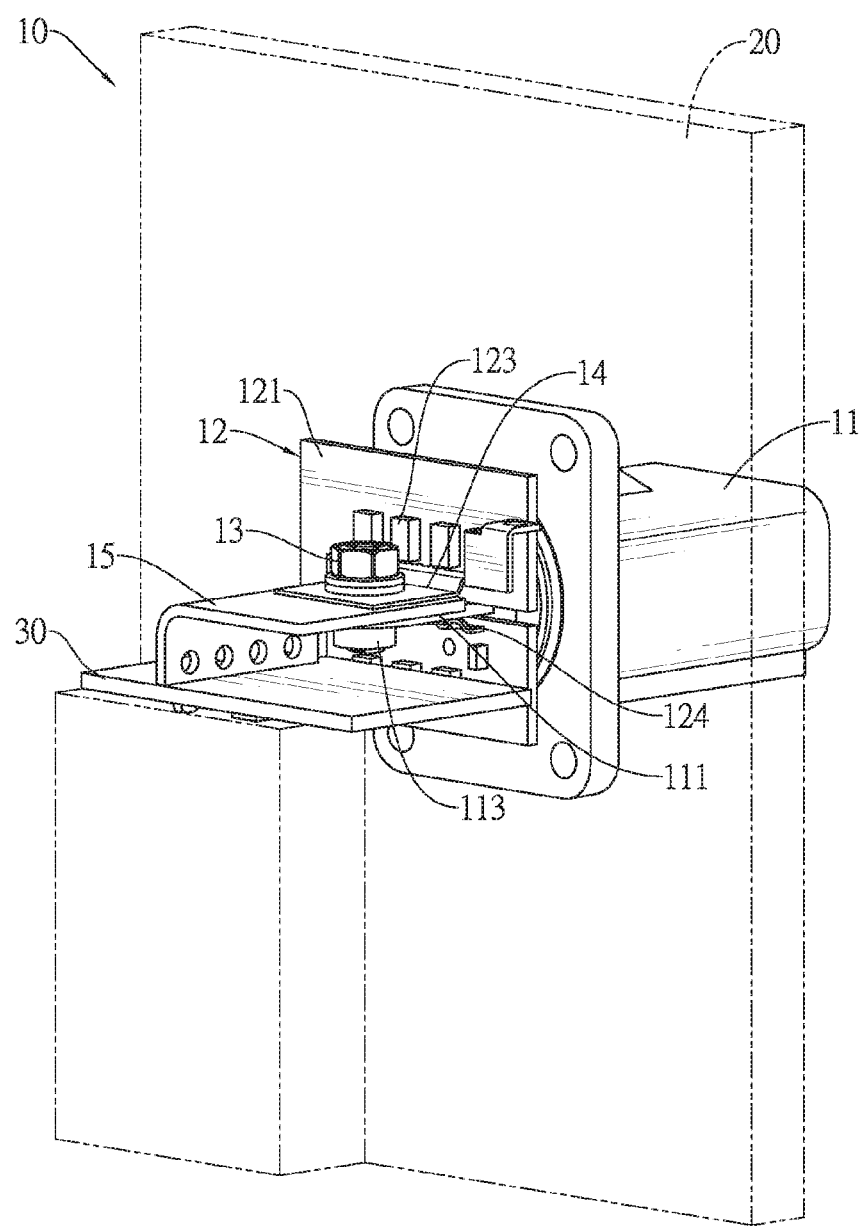
FIG. 1 is a perspective view of a first embodiment of a filtered connector in accordance with the present invention mounted on a casing.

With reference to FIGS. 1 to 4, a first embodiment of a filtered connector 10 in accordance with the present invention is mounted on a casing 20 and includes a connection port 11 and a filter board 12. One end of the connection port 11 is mounted through and securely held in a through hole 21 of the casing 20. The connection port 11 has an electrode plate 111 mounted on the end of the connection port 11. The filter board 12 includes a circuit board assembly 121, multiple grounding spring plates 122 and multiple filtering capacitors 123. The circuit board assembly 121 has an elongated slot 1210 formed through the circuit board assembly 121 to adjoin a first surface 1211 and a second surface 1212 of the circuit board assembly 121. The first surface 1211 and the second surface 1212 are opposite each other. The second surface 1212 faces the casing 20.

The multiple grounding spring plates 122 are mounted on the second surface 1212 of the circuit board assembly 121 and are electrically connected to the casing 20. The electrode plate 111 of the connection port 11 is mounted through the elongated slot 1210 of the circuit board assembly 121 and is electrically isolated from the multiple grounding spring plates 122 and the casing 20. The multiple filtering capacitors 123 are mounted on the first surface 1211 of the circuit board assembly 121. One end of each filtering capacitor 123 is electrically connected to the electrode plate 111 of the connection port 11, and the other end of the filtering capacitor 123 is electrically connected to the multiple grounding spring plates 122.

Figure 4:
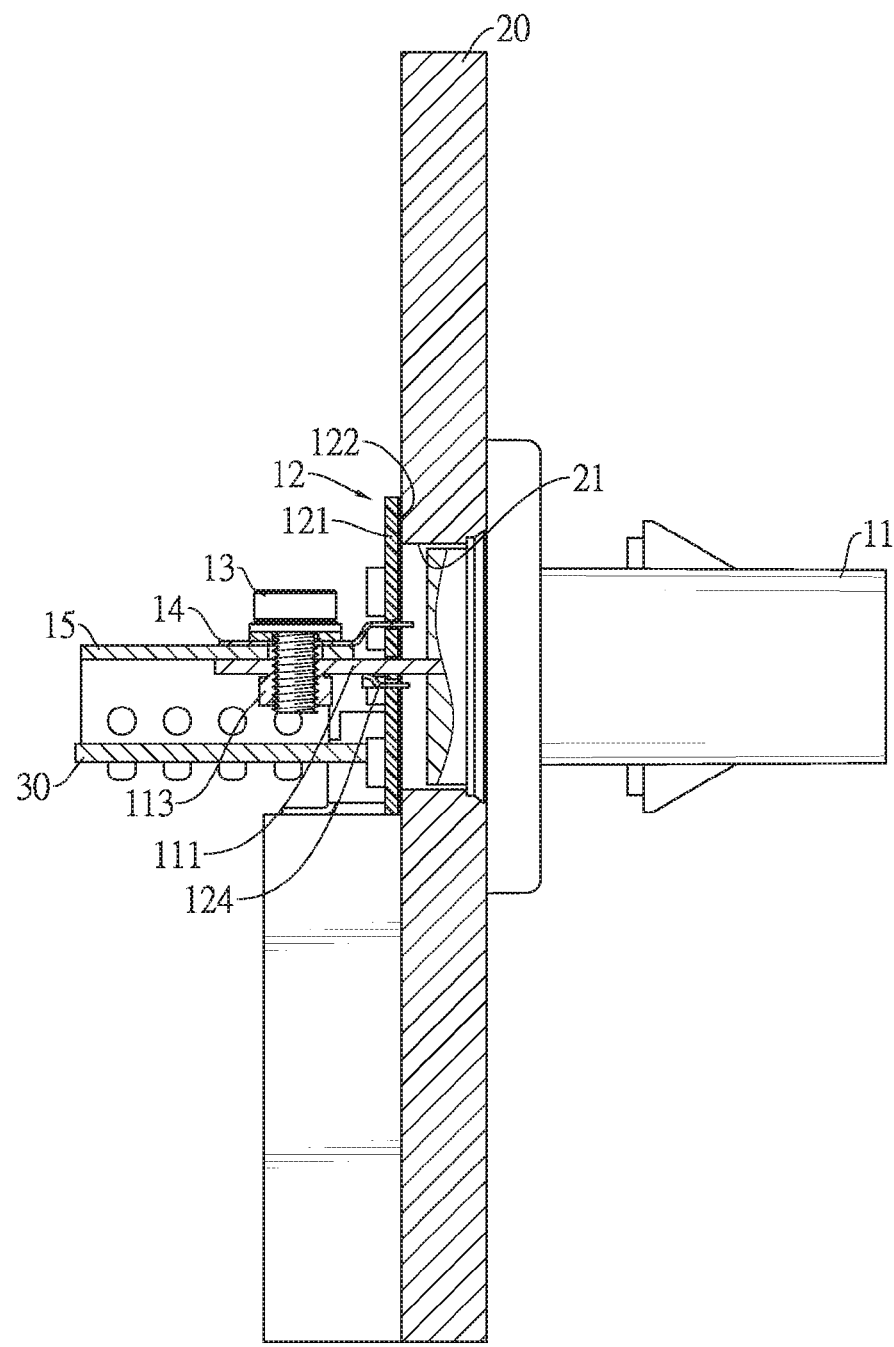
FIG. 4 is a cross-sectional side view of the filtered connector in FIG. 1.

With further reference to FIG. 4, the multiple grounding spring plates 122 abut against the casing 20 to electrically connect to the casing 20. The multiple filtering capacitors 123 are electrically connected to the casing 20 through the multiple grounding spring plates 122. As the grounding spring plates 122 are mounted on the second surface 1212 of the circuit board assembly 121 and face the casing 20, when the connection port 11 is mounted through the through hole 21 of the casing 20, the grounding spring plates 122 are compressed and deformed to abut against and electrically contact the casing 20.

Figure 5:
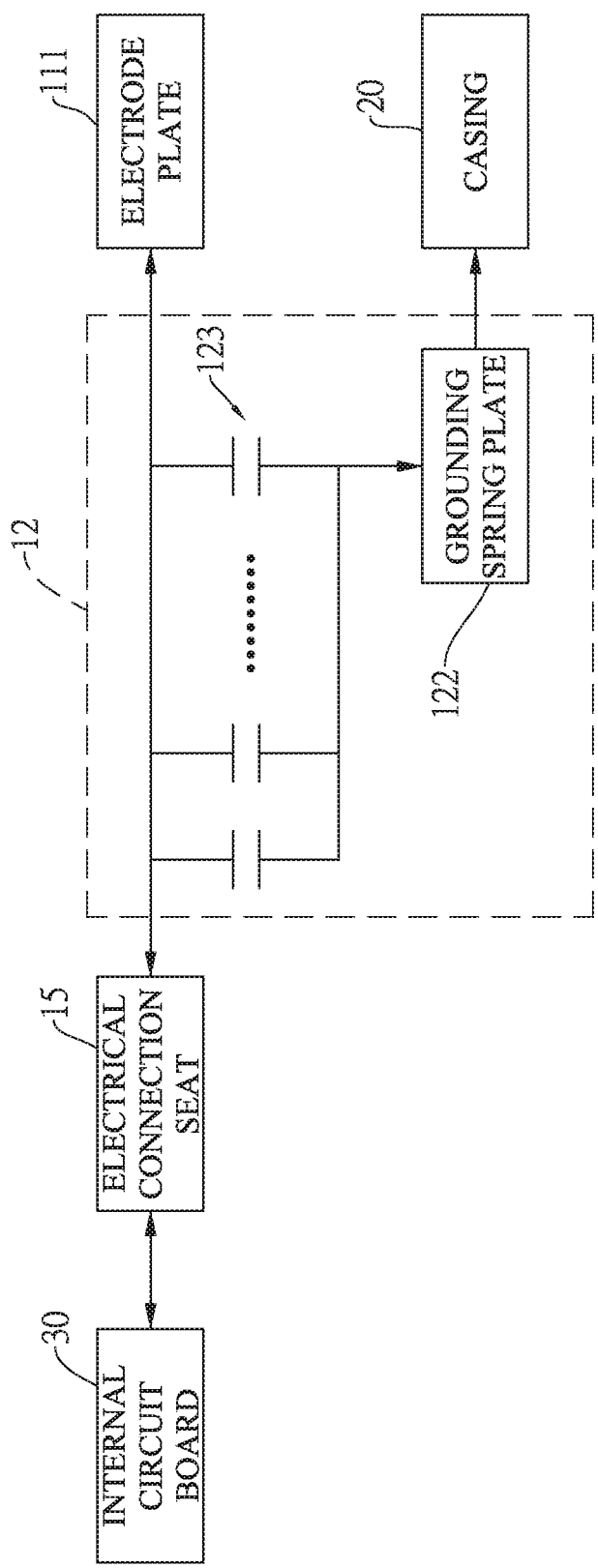
FIG. 5 is a functional circuit diagram of the filtered connector in FIG. 1.

With reference to FIG. 5, a simplified circuit diagram is shown to illustrate electrical connection of the filtered connector 10. As the circuit board assembly 121 has at least one wire, the filtering capacitors 123 are connected between the electrode plate 111 and the casing 20 through the at least one wire on the circuit board assembly 121.

The connection port 11 and the filter board 12 of the filtered connector 10 are separately mounted, such that the filter board 12 directly contacts the casing 20 through the grounding spring plates 122 to provide a grounding path. As the grounding capacitors 123 are connected across the electrode plate 111 of the connection port 11 and the grounding spring plates 122, the electrode plate 111 of the connection port 11 may be grounded through the grounding capacitors 123 to avoid high frequency noises through a grounding path, reduce generation of electromagnetic waves, and suppress the EMI. Hence, upon installation of the filtered connector 10, only the filter board 12 needs to be additionally mounted in addition to the originally available connection port 11. The electrode plate 111 of the connection port 11 is mounted through the elongated slot 1210 of the circuit board assembly 121 in completion of the installation without burdening the users for the sake of replacement of the entire connector.

The filter board 12 further has a metallic EMI shielding layer formed on the circuit board assembly 121 for EMI shielding. Thus, electromagnetic waves generated by internal circuits of the filtered connector can be shielded by the metallic EMI shielding layer for prevention of electromagnetic leakage and EMI reduction.

In the present embodiment, a width of the elongated slot 1210 of the circuit board assembly 121 matches a thickness of the electrode plate 111 of the connection port 11, and when the electrode plate 111 is mounted through the elongated slot 1210, the electrode plate 111 is tightly held by a top inner edge and a bottom inner edge of the elongated slot 1210 with no gap formed between the electrode plate 111 and the elongated slot 1210. As a result, electromagnetic waves generated by the internal circuits of the filtered connector won't leak through gap formed between the electrode plate 111 of the connection port 11 and the elongated slot 1210 of the circuit board assembly 121.

Figure 2:
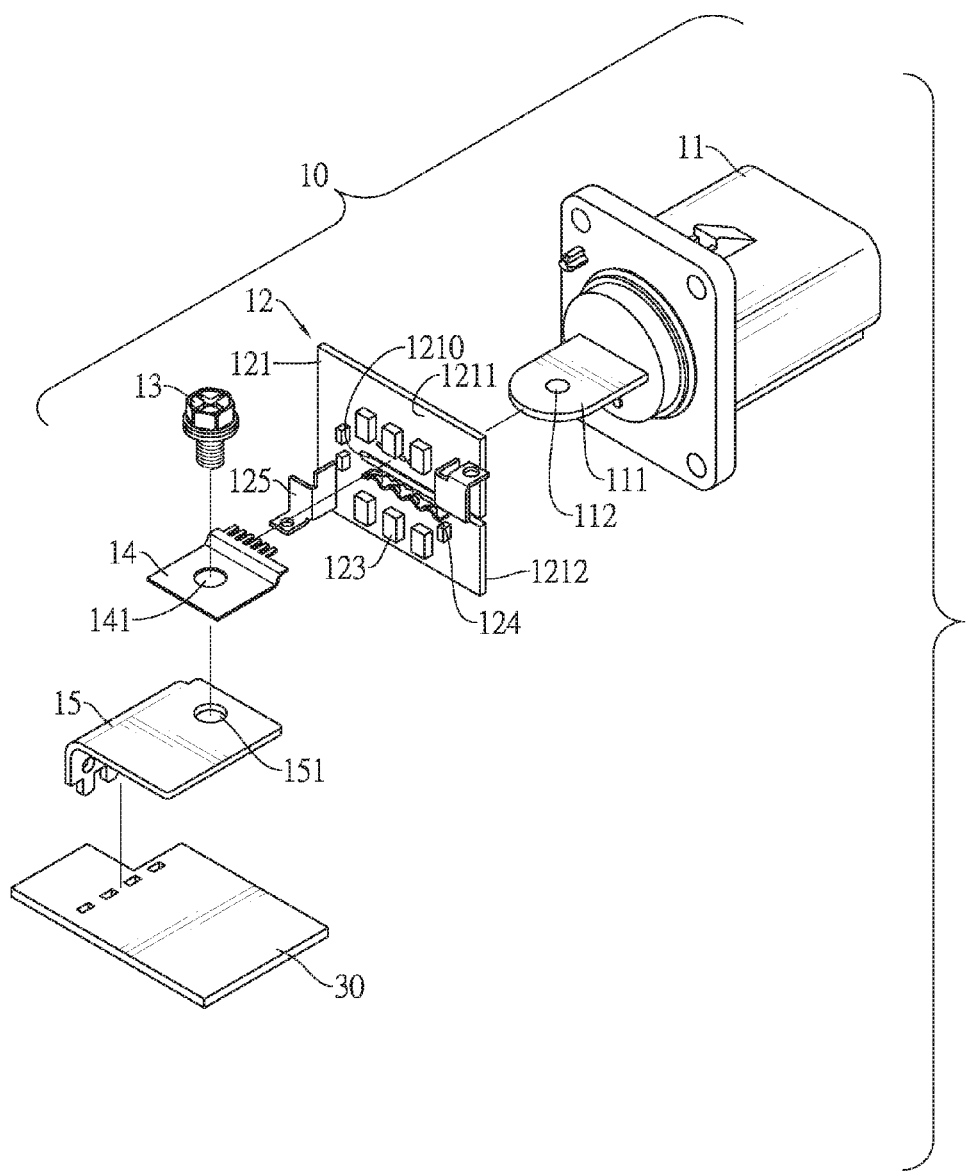
FIG. 2 is an exploded perspective view of the filtered connector in FIG. 1.
Figure 3:
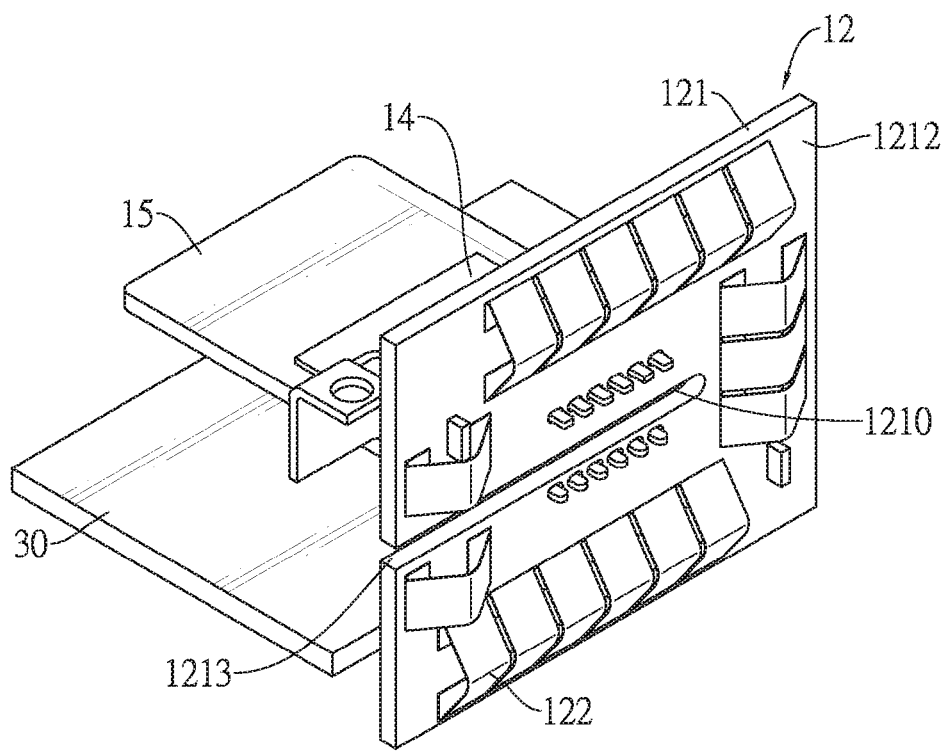
FIG. 3 is another perspective view of the filter connector in FIG. 1.
Figure 6:
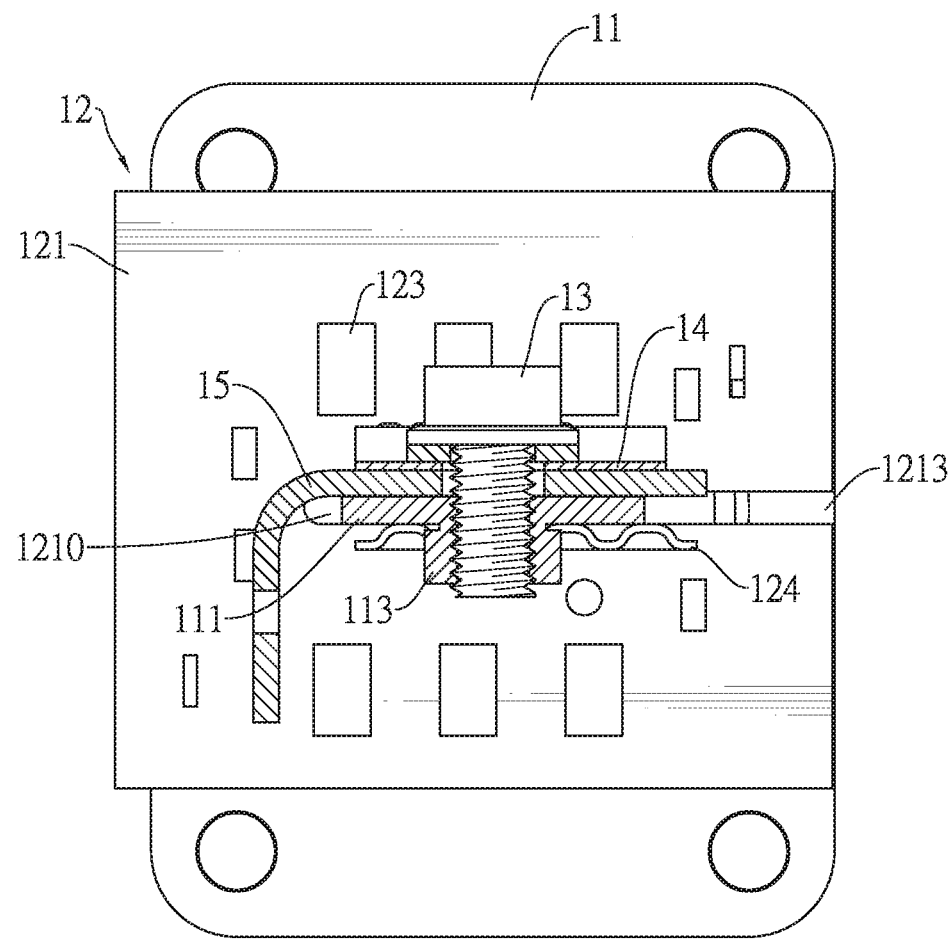
FIG. 6 is a rear view in partial section of the filtered connector in FIG. 1 illustrating portions of the filtered connector fastened by a bolt.

With reference to FIGS. 2 and 6, the filtered connector 10 further includes a bolt 13, an electrical connection holding plate 14 and an electrical connection seat 15.

The electrode plate 111 of the connection port 11 has a first locking hole 112 formed through the electrode plate 111. One edge of the electrical connection holding plate 14 is securely and electrically connected with the circuit board assembly 121, and the electrical connection holding plate 14 has a second locking hole 141 formed through the electrical connection holding plate 14 and aligning with the first locking hole 112. In the present embodiment, the electrical connection holding plate 14 is soldered to the circuit board assembly 121 for secure and electrical connection with the circuit board assembly 121.

The electrical connection seat 15 is L-shaped and has a horizontal portion, a vertical portion and a third locking hole 151. The vertical portion of the electrical connection seat 15 is connected with the horizontal portion. The third locking hole 151 is formed through the horizontal portion of the electrical connection seat 15 and is aligned with the second locking hole 141. A free edge of the vertical portion of the electrical connection seat 15 is securely and electrically connected with an internal circuit board 30. The horizontal portion of the electrical connection seat 15 is sandwiched by the electrode plate 111 of the connection port 11 and the electrical connection holding plate 14.

The bolt 13 is securely mounted through the first locking hole 112, the second locking hole 141 and the third locking hole 151 to fasten the electrode plate 111 of the connection port 11, the electrical connection holding plate 14 and the electrical connection seat 15 together.

As the electrical connection holding plate 14 is securely and electrically connected with the circuit board assembly 121 and the bolt 13 is securely and electrically connected with the electrode plate 111 of the connection port 11, the electrode plate 111 of the connection port 11 is securely and electrically connected with the circuit board assembly 121 through the electrical connection holding plate 14, such that the electrode plate 111 of the connection port 11 is electrically connected to the multiple filtering capacitors 123 of the filter board 12 to screen out high frequency noises by means of the filtering capacitors 123 and the connection port 11 is securely connected with the filter board 12.

The electrode plate 111 of the connection port 11 further has an annular protrusion 113 formed on and protruding downwardly from a bottom surface of the electrode plate 111 with the first locking hole 112 formed through the annular protrusion 113, such that a depth of the first locking hole 112 can be increased, and the bolt 13 is mounted through the annular protrusion 113 of the electrode plate 111 and is firmly locked in the first locking hole 112. The elongated slot 1210 is formed in a lateral edge of the circuit board assembly 121 in generation of an opening 1213 located on the lateral edge and communicating with the elongated slot 1210 for a portion of the electrode plate 111 other than the annular protrusion 113 to be inserted in the elongated slot 1210 through the opening 1213. The structure of the elongated slot 1210 allows the electrode plate 111 of the connection port 11 to be mounted through the elongated slot 1210 of the circuit board assembly 121.

Figure 7:
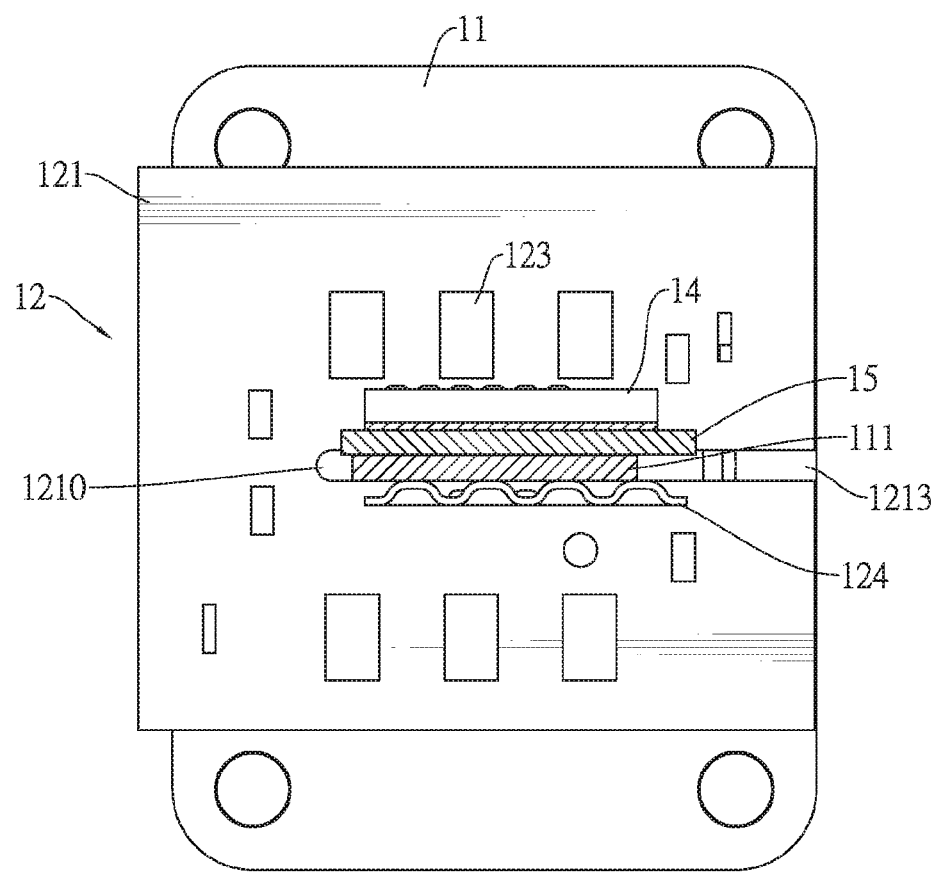
FIG. 7 is another rear view in partial section of the filtered connector in FIG. 1 illustrating portions of the filtered connector in contact with an electrode plate of the filtered connector.

With reference to FIGS. 2, 6 and 7, the filter board 12 further includes at least one electrical connection spring leaf 124 mounted on the first surface 1211 of the circuit board assembly 121 and located near the bottom inner edge of the elongated slot 1210 to abut against the bottom surface of the electrode plate 111 of the connection port 11. The at least one electrical connection spring leaf 124 is electrically connected to the multiple filtering capacitors 123 through traces on the circuit board assembly 121, and the electrode plate 111 is electrically connected to the filtering capacitors 123 through the at least one electrical connection spring leaf 124.

Figure 8:
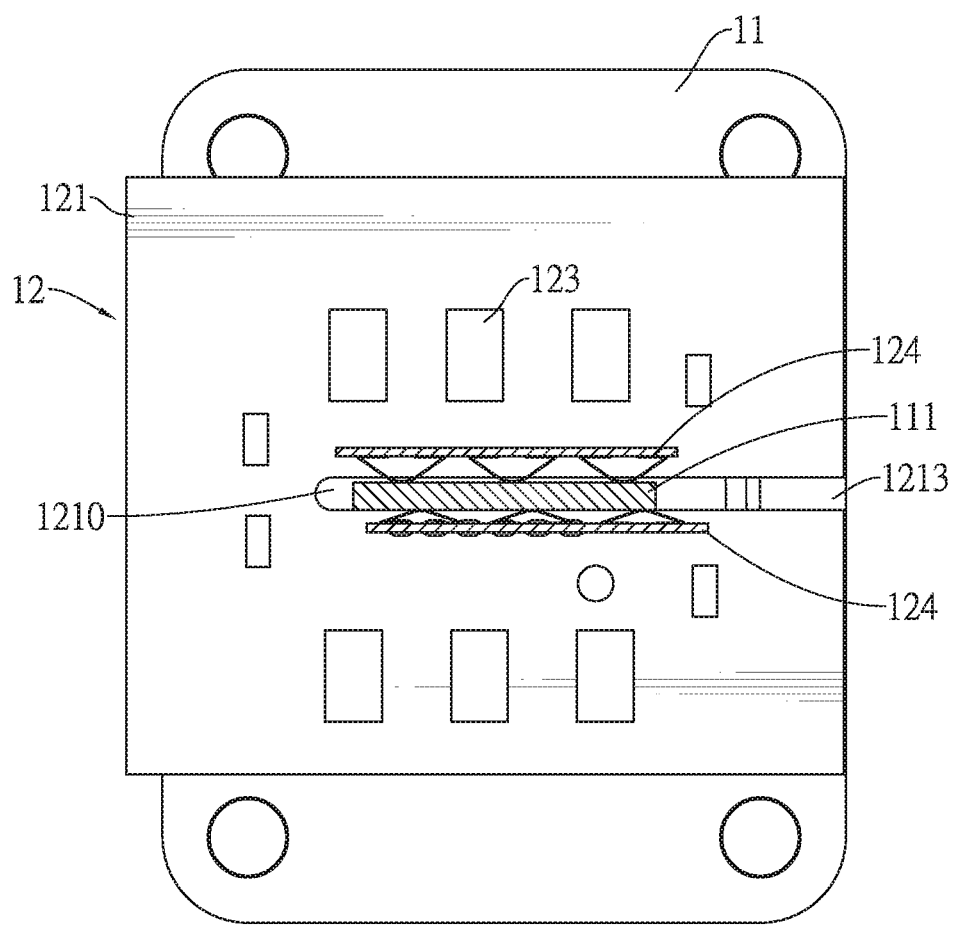
FIG. 8 is a rear view in partial section of a second embodiment of a filtered connector in accordance with the present invention illustrating portions of the filtered connector in contact with an electrode plate of the filtered connector.

With reference to FIG. 8, a second embodiment of a filtered connector in accordance with the present invention differs from the foregoing embodiment in that the filter board 12 includes two electrical connection spring leaves 124 mounted on the first surface 1211 of the circuit board assembly 121 and respectively located near the top inner edge and the bottom inner edge of the elongated slot 1210 to respectively abut against a top surface and a bottom surface of the electrode plate 111 for holding the electrode plate 111. Accordingly, when mounted through the elongated slot 1210 of the circuit board assembly 121, the electrode plate 111 of the connection port 11 is held by the two electrical connection spring leaves 124 to ensure secure and electrical connection of the circuit board assembly 121 and the electrode plate 111 through the two electrical connection spring leaves 124.

Figure 9:
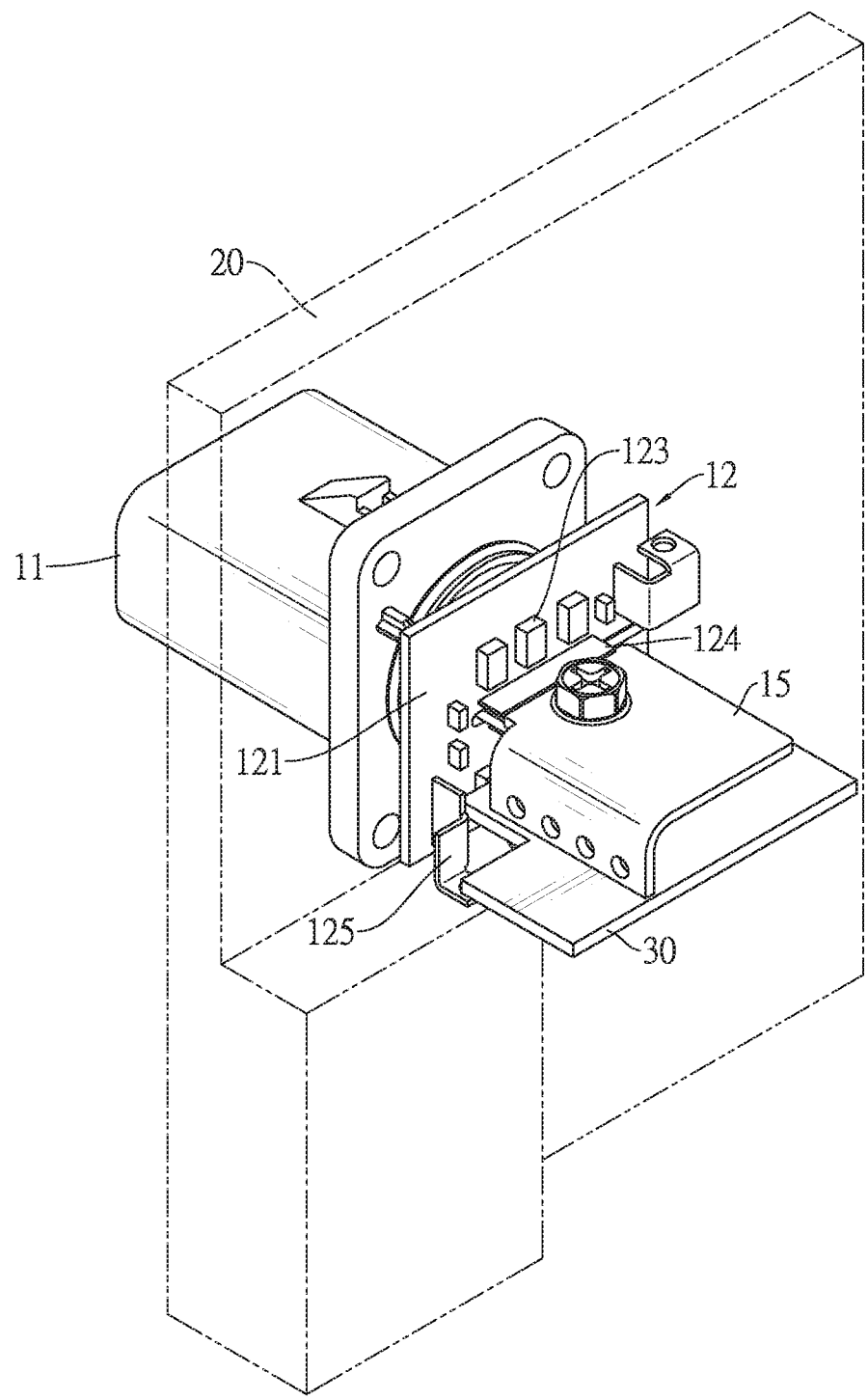
FIG. 9 is another perspective view of the filtered connector in FIG. 1.

With reference to FIG. 9, the filter board 12 of the first embodiment further includes a metallic connection ear 125 with one portion thereof securely connected with the circuit board assembly 121 of the filter board 12 and another portion thereof securely connected with the casing 20. The filter board 12 can be firmly and electrically connected with the casing 20 through the metallic connection ear 125 to additionally provide a grounding path of the filter board 12 and enhance a filtering efficiency of the filter board 12. In the present embodiment, the metallic connection ear 125 is soldered on the circuit board assembly 121 and is fastened on the casing 20.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A filtered connector mounted on a casing and comprising:
   a connection port having an electrode plate mounted on an end of the connector port adapted to be mounted through and securely held in a through hole of the casing;
   a filter board having:
      a circuit board assembly having an elongated slot formed through the circuit board assembly to adjoin a first surface and a second surface of the circuit board assembly, wherein the first surface and the second surface are opposite each other, the second surface faces the casing, and the electrode plate of the connection port is mounted through the elongated slot;
      multiple grounding spring plates mounted on the second surface of the circuit board assembly to electrically contact the casing; and
      multiple filtering capacitors mounted on the first surface of the circuit board assembly, wherein one end of each filtering capacitor is electrically connected to the electrode plate of the connection port, and the other end of the filtering capacitor is electrically connected to the multiple grounding spring plates;
   a fastener;
   an electrical connection holding plate, wherein one edge of the electrical connection holding plate is securely and electrically connected with the circuit board assembly of the filter board, and the electrical connection holding plate has a second locking hole formed through the electrical connection holding plate; and
   an electrical connection seat having a third locking hole formed through one portion of the electrical connection seat, wherein another portion of the electrical connection seat is securely and electrically connected with an internal circuit board, and the third locking hole is aligned with the second locking hole of the electrical connection holding plate;
   wherein the electrode plate of the connection port has a first locking hole aligned with the second locking hole and the third locking hole, and the fastener is securely mounted through the first locking hole, the second locking hole and the third locking hole.

2. The filtered connector as claimed in claim 1, wherein the electrode plate of the connection port further has an annular protrusion formed on and protruding downwardly from a bottom surface of the electrode plate with the first locking hole formed through the annular protrusion, wherein the fastener is securely mounted through the annular protrusion of the electrode plate; and
   the elongated slot is formed in a lateral edge of the circuit board assembly to form an opening located on the lateral edge and communicating with the elongated slot.

3. The filtered connector as claimed in claim 1, wherein the filter board further includes at least one electrical connection spring leaf mounted on the first surface of the circuit board assembly and located near a bottom inner edge of the elongated slot to abut against a bottom surface of the electrode plate of the connection port, wherein the at least one electrical connection spring leaf is electrically connected to the multiple filtering capacitors, and the electrode plate is electrically connected to the filtering capacitors through the at least one electrical connection spring leaf.

4. The filtered connector as claimed in claim 1, wherein the filter board further includes two electrical connection spring leaves mounted on the first surface of the circuit board assembly and respectively located near a top inner edge and a bottom inner edge of the elongated slot to respectively abut against a top surface and a bottom surface of the electrode plate, and the electrode plate is electrically connected to the filtering capacitors through the two electrical connection spring leaves.

5. The filtered connector as claimed in claim 3, wherein the filter board further includes a metallic electromagnetic interference (EMI) shielding layer formed on the circuit board assembly.

6. The filtered connector as claimed in claim 4, wherein the filter board further includes a metallic electromagnetic interference (EMI) shielding layer formed on the circuit board assembly.

7. The filtered connector as claimed in claim 1, wherein the filter board further includes a metallic connection ear with one portion thereof securely connected with the circuit board assembly of the filter board and another portion thereof securely connected with the casing.

\* \* \* \* \*